US007335601B2

(12) United States Patent
Han et al.

(10) Patent No.: US 7,335,601 B2
(45) Date of Patent: Feb. 26, 2008

(54) METHOD OF PROCESSING AN OBJECT AND METHOD OF CONTROLLING PROCESSING APPARATUS TO PREVENT CONTAMINATION OF THE OBJECT

(75) Inventors: Jae-Hyun Han, Hwaseong-si (KR); Seung-Ki Chae, Seoul (KR); Kee-Soo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 32 days.

(21) Appl. No.: 11/255,995

(22) Filed: Oct. 24, 2005

(65) Prior Publication Data

US 2006/0102588 A1 May 18, 2006

(30) Foreign Application Priority Data

Nov. 12, 2004 (KR) .................. 10-2004-0092380

(51) Int. Cl.
*H01L 21/302* (2006.01)
(52) U.S. Cl. .................. 438/714; 216/67; 216/71; 134/1.2; 134/21; 134/22.1
(58) Field of Classification Search .............. 134/1.2, 134/21, 22.1; 216/67, 71; 438/705, 714, 438/905, 906
See application file for complete search history.

(56) References Cited

U.S. PATENT DOCUMENTS

| 5,102,496 A | * | 4/1992 | Savas | ...................... 216/69 |
| 5,328,555 A | * | 7/1994 | Gupta | ...................... 134/1.2 |
| 5,573,597 A | | 11/1996 | Lantsman | |
| 5,945,354 A | * | 8/1999 | Mautz | ...................... 438/731 |
| 2005/0039773 A1 | * | 2/2005 | Moriya et al. | ............... 134/1.2 |
| 2006/0060303 A1 | * | 3/2006 | Fink et al. | ............. 156/345.29 |

FOREIGN PATENT DOCUMENTS

| EP | 1119030 | * | 7/2001 |
| JP | 06-069162 | * | 3/1994 |
| JP | 07-106307 | * | 4/1995 |
| JP | 2003-031553 | * | 1/2003 |
| JP | 2003-100720 | | 4/2003 |
| KR | 1999-71110 | | 9/1999 |
| KR | 1020040022346 A | | 3/2004 |

* cited by examiner

*Primary Examiner*—George A. Goudreau
(74) *Attorney, Agent, or Firm*—Volentine & Whitt, PLLC

(57) ABSTRACT

A method of manufacture includes processing an object in a chamber and subsequently generating an electrical force of attraction to float contaminants off of a region adjacent the processed object before the object is unloaded from the chamber. The object may be processed with the use of plasma. The plasma is produced by introducing a first gas into the chamber and applying a source power to the first gas. The plasma is extinguished after the object is processed with the use of the plasma. Then, a second gas is introduced into the chamber and a source power is applied to the second gas to generate the electrical force of attraction. At this time, the parameters are controlled so that particle contaminants are readily removed without any influence on the object. Also, the same electrode can be used to apply source power to both the first and second gas. Thus, the operation of removing the particle contaminants is relatively simple.

17 Claims, 3 Drawing Sheets

METHOD OF PROCESSING AN OBJECT AND METHOD OF CONTROLLING PROCESSING APPARATUS TO PREVENT CONTAMINATION OF THE OBJECT

BACKGROUND OF THE INVENTION

1. Field of the Invention

The present invention relates to a method of manufacturing a semiconductor device or the like. More particularly, the present invention relates to a method of processing a substrate using plasma.

2. Description of the Related Art

A semiconductor device is generally manufactured in part by forming a layer on a semiconductor substrate, forming an etching mask on the layer, and etching the layer through the etching mask to pattern the layer. Plasma is often used as the means to form such a layer on a substrate and/or to etch a layer formed on a substrate. In particular, plasma is widely used in the manufacturing of a semiconductor device wherein the design rule is less than about 0.13 µm.

A conventional process using plasma is carried out as follows. First, a semiconductor substrate is positioned in a chamber. Then, a bias power and a source power are applied to the chamber while a source gas is supplied into the chamber to generate the plasma. The semiconductor substrate is processed in the chamber using the plasma. Subsequently, the generating of the plasma is suspended, and a purge gas is supplied into the chamber to purge the chamber. Finally, the processed semiconductor substrate is unloaded from the chamber.

The semiconductor substrate is usually disposed on an electrostatic chuck (ESC) while is it being processed by the plasma. Direct current is supplied to the ESC to generate a Coulomb force that acts on the semiconductor substrate to attract the substrate to the ESC. After the plasma is extinguished, the current to the ESC is cut off. Accordingly, the semiconductor substrate is released from the ESC. At this time, the purge gas aids in discharging the semiconductor substrate.

Moreover, electrons having a high mobility frequently collide against particles in the plasma such that the particles acquire electric charges. However, the energy provided to the particles in the plasma is cut off once the plasma in the chamber is extinguished. Accordingly, the particles collect in regions adjacent the semiconductor substrate due to gravity and the Coulomb force acting on the semiconductor substrate. The particles act as contaminants. In particular, a great number of particles are present in the chamber when the semiconductor substrate is discharged by the purge gas and thus, the substrate is likely to become contaminated before it is unloaded from the chamber.

Methods for minimizing the number of particles remaining in the area adjacent the semiconductor substrate, after the substrate has been processed using a plasma, are disclosed in Korea Patent Laid-Open Publication No. 2004-22346, Japan Patent Laid-Open Publication No. 2003-100720, and U.S. Pat. No. 5,573,597 (issued to Lantsman). In a method disclosed in Korea Patent Laid-Open Publication No. 2004-22346, the processing chamber is purged using a gas that is excited by a high frequency power, once the plasma has been extinguished. However, it is still difficult using this technique to detach particles that are held to the semiconductor substrate by a Van der Waals force. In a method disclosed in Japan Patent Laid-Open Publication No. 2003-1000720, the contaminants are collected using a separate electrode provided in the processing chamber. However, the control and timing of the operation of the separate electrode render this method complicated. In a method disclosed in U.S. Pat. No. 5,573,597, once the generating of plasma is suspended, the bias power is controlled to create a repulsive force that prevents contaminants from accumulating on and around the semiconductor substrate. However, the repulsive force also acts to repel the semiconductor substrate to such an extent that the substrate may pop up off of the wafer chuck. As a result, the substrate can be damaged, especially by the member that is used to unload the substrate after it is processed.

Thus, damage to and failure of the semiconductor device due to contaminants, such as particulate contaminates, continue to frequently occur as the result of the processing of the substrate of the device using plasma.

SUMMARY OF THE INVENTION

An object of the present invention is to provide a method of manufacture that readily removes potential contaminants from a peripheral region of an object after the object has been processed.

A more specific object of the present invention is to provide a method of manufacture using plasma, wherein particle contaminants created as the result of the processing of an object with the use of the plasma are readily removed from a peripheral region of the object.

Similarly, another object of the present invention is to provide a method of controlling an apparatus that processes an object with the use of plasma, wherein particle contaminants are removed from a peripheral region of the object by controlling only components, e.g. electrodes, which are necessary for generating the plasma used to process the object in the first place.

In accordance with one aspect of the present invention, an electrical force of attraction is generated in a region spaced apart from the processed object. The force of attraction is generated so as to be great enough to float contaminants off of the area adjacent the processed object. In general, the electrical force of attraction has a net charge of one polarity whereas the particles have a net charge of the opposite polarity.

In accordance with another aspect of the present invention, the object is fixed in place in a chamber using a Coulomb force, the object is processed within the chamber with the use of a first plasma, the first plasma is extinguished after the object has been processed, then the Coulomb force is eliminated, and finally an electrical force of attraction, sufficient to attract the contaminant particles away from the object in the chamber, is produced. The electrical force of attraction is produced by providing a second source gas excited with a source power in a region of the chamber spaced from the substrate. The Coulomb force is produced using an electrostatic chuck on which the object is supported and, in particular, by supplying direct current to the chuck.

In accordance with still another aspect of the present invention, a method of controlling the processing of an object using plasma includes supplying a first source gas into a processing chamber, applying a first source power to a first electrode in the chamber to convert the first source gas into a first plasma, applying a bias power to a second electrode in the chamber to accelerate ions of the first plasma towards the second electrode, processing the object with the use of the first plasma, subsequently extinguishing the first plasma to finish the processing of the object, subsequently supplying a second gas into the chamber, and applying a source power to the first electrode to convert the second gas to a second plasma. The second plasma is thus produced in a region of the chamber spaced from the object.

According to the present invention, the contaminants remaining on and around the object can be removed using the electrical force of attraction. In particular, the same electrode used to apply power to the source gas for producing the plasma is used to generate the electrical force of attraction after the object has been processed. Therefore, the plasma processing apparatus does not require a component, such as an additional electrode, that is extraneous to the process of producing plasma. Also, the electrical force for attracting the particle contaminants is generated in the region in which the plasma is produced and hence, is generated in a region spaced apart from the object. The electrical force of attraction can be calibrated to float the contaminant particles away from the object. However, these same charges have little effect on the object due to the distance between the charges and the object and the relatively large mass of the object. Hence, the object will not be moved before it is unloaded from the chamber.

BRIEF DESCRIPTION OF THE DRAWINGS

The above and other features and advantages of the present invention will become more apparent from the following detailed description of the preferred embodiments thereof made with reference to the accompanying drawings, in which.

DETAILED DESCRIPTION OF THE PREFERRED EMBODIMENTS

The present invention will now be described more fully hereinafter with reference to the accompanying drawings.

Figure 1:
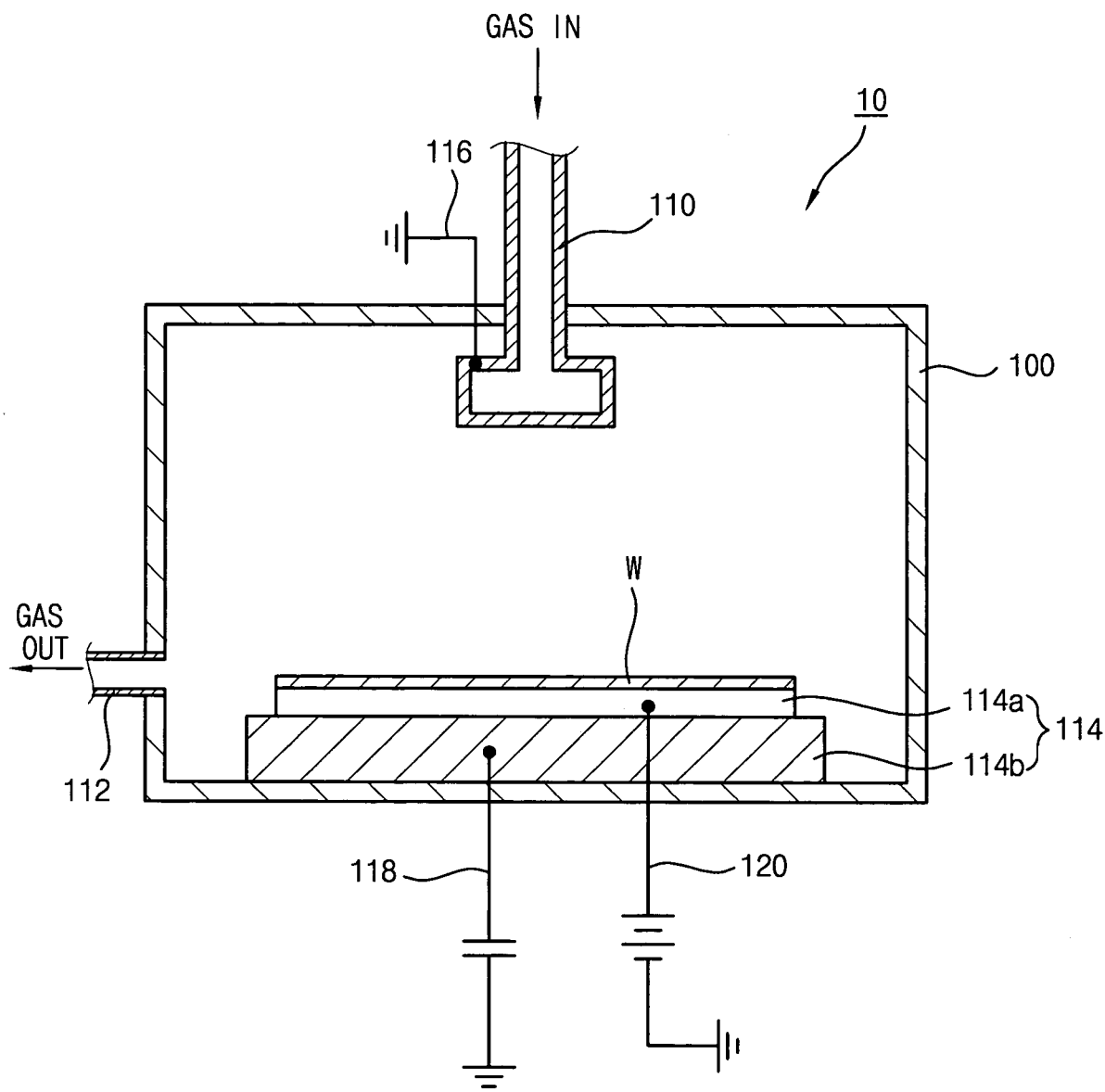
FIG. 1 is a sectional view of an apparatus for processing an object in accordance with the present invention.

Referring first to FIG. 1, an apparatus 10 for processing an object includes a processing chamber 100, a gas supply system for introducing gas into the chamber 100, an exhaust system for exhausting gas and by-products from the chamber 100, a substrate support 114 disposed in the chamber for supporting the object to be processed such as a semiconductor substrate W, and a power supply system. The gas supply system includes gas-supplying member 110 extending into the chamber 100 and through which gas flows into the chamber 100. The exhaust system includes a vacuum pump or the like and a gas-exhausting member 112 connected to the chamber. Gas is exhausted from the gas from the chamber 100 through the gas-exhausting member 112 under the suction created by the vacuum pump. The substrate 114 supports a semiconductor substrate W or the like in the chamber 100 while the substrate W is being processed.

More specifically, the gas-supplying member 110 is in open communication with the interior of the chamber 100. In this respect, the gas-supplying member 110 may have diffusing holes for introducing the gas uniformly into the chamber 100. The support 114 may include a chuck 114a for holding the semiconductor substrate W, and a susceptor 114b supporting the chuck 114a.

The apparatus 10 may process the semiconductor substrate W using plasma. In this case, a source power line 116 is electrically connected to the gas-supplying member 110 such that the gas-supplying member serves as an upper electrode. A bias power line 118 is electrically connected to the support 114 such that the support 114 serves as a lower electrode. In particular, the bias power line 118 is electrically connected to the susceptor 114b of the support 114. The chuck 114a of the support 114 may be an electrostatic chuck, such as bipolar type of electrostatic chuck or a mono-polar type of electrostatic chuck, for holding the semiconductor substrate W using a Coulomb force. In this case, a direct current power line 120 is electrically connected to the chuck 114a.

The process performed by the apparatus 10 may be a deposition process in which material is deposited on the substrate W in the chamber 100 to form a layer on the substrate W. For example, a plasma-enhanced oxide layer may be formed on the semiconductor substrate W. In this case, silane ($SiH_4$) is introduced into the chamber 100 through the gas-supplying member 110. On the other hand, the process performed by the apparatus 10 may be an etching process in which the plasma-enhanced oxide layer formed on the substrate W is etched in the chamber 100. In this case, carbon tetrafluoromethane ($CF_4$) is introduced into the chamber 100 through the gas-supplying member 110.

Figure 2:
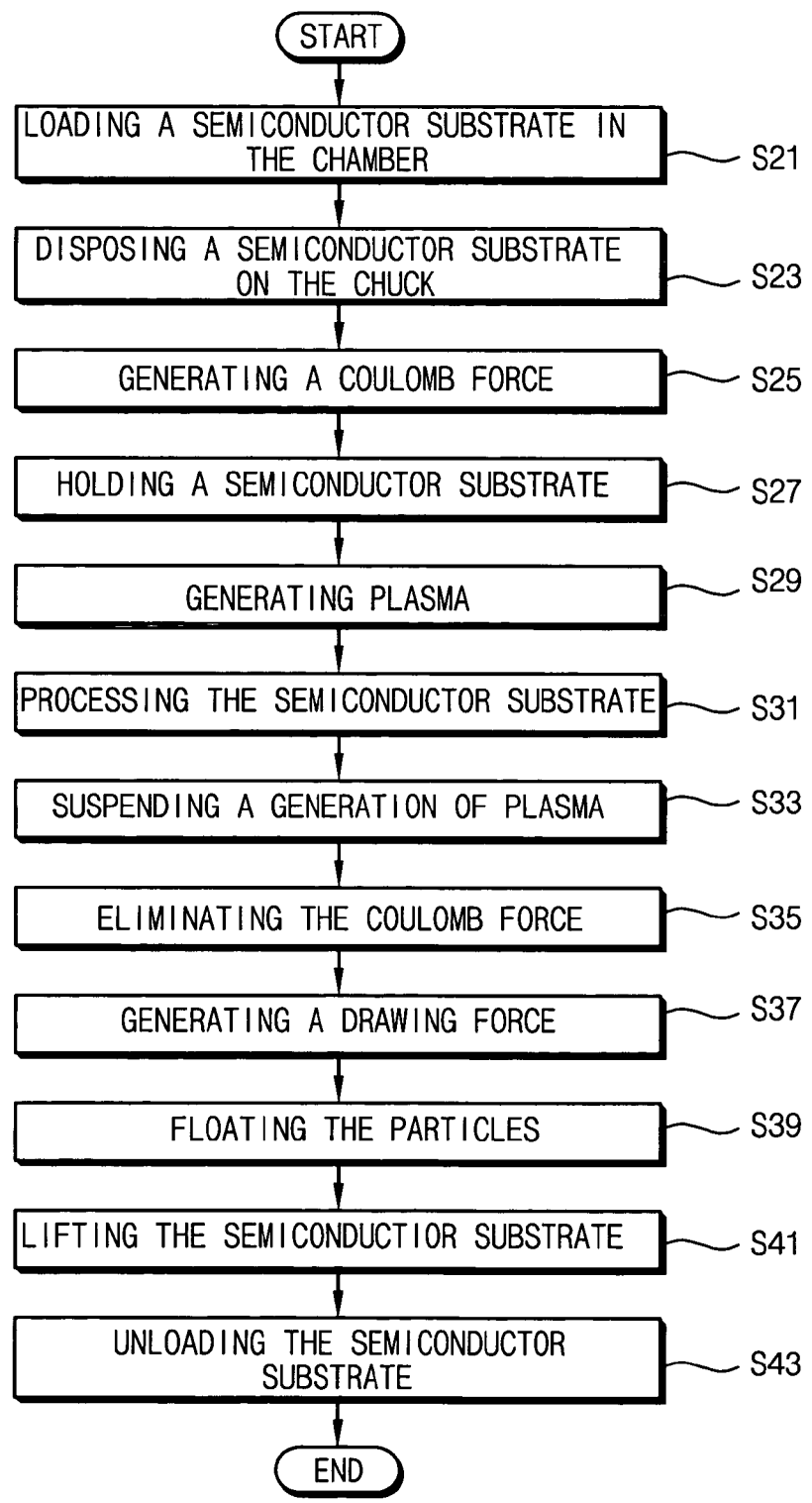
FIG. 2 is a flow chart illustrating a method of processing an object in accordance with the present invention.
Figure 3:
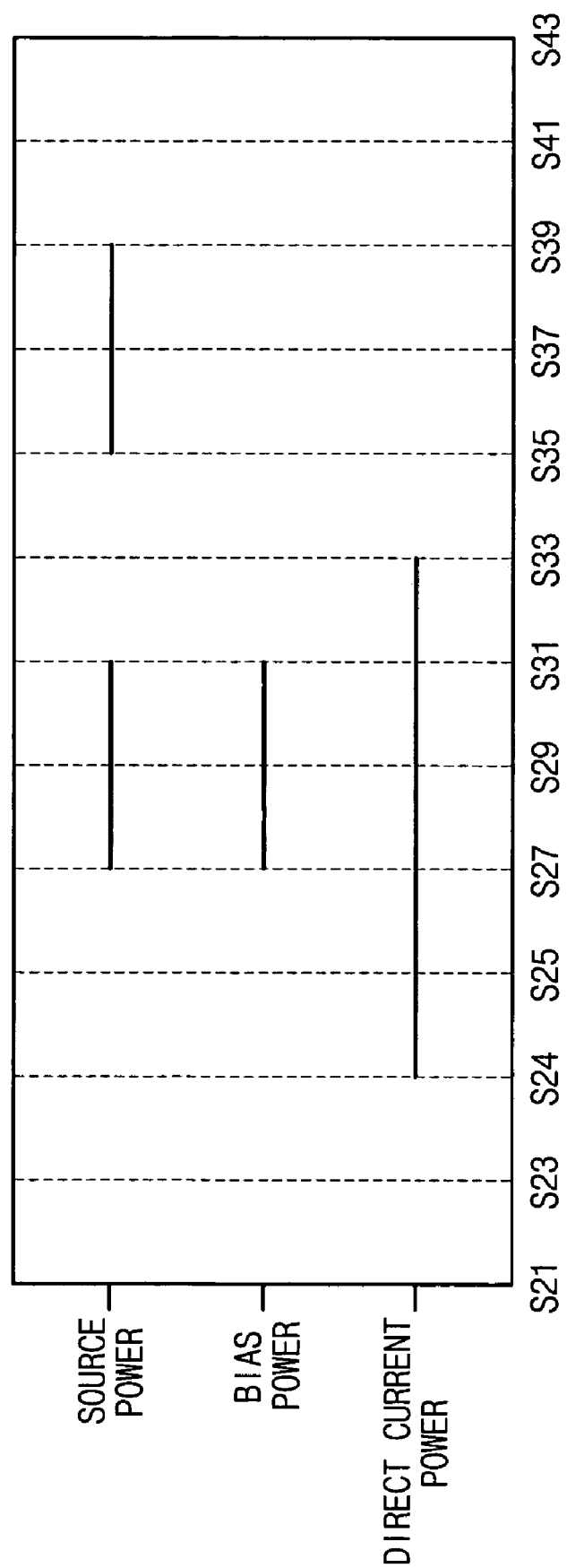
FIG. 3 is a timing chart illustrating the timing under which a source power, a bias power, and a direct current are supplied and interrupted when performing the method in FIG. 2.

A method of processing an object using the apparatus 10 will now be described in more detail with reference to FIGS. 2 and 3.

First, the semiconductor substrate W is loaded into the chamber 100 (S21). In this respect, the semiconductor substrate W may be transferred into the chamber 100 using a blade.

Next, the semiconductor substrate W is placed on the chuck 114a in the chamber 100 (S23). Direct current is supplied to the chuck 114a through the direct current power line 120. In this embodiment, the direct current is supplied by impressing a voltage of about 100 to 300 V, preferably of about 150 to 250 V, and more preferably of about 200 V, across the chuck 114a. Accordingly, a Coulomb force is generated by the chuck 114a (S25) to thereby attract the semiconductor substrate W to the chuck 114a (S27).

Next, a first plasma is generated in the chamber 100 (S29). In particular, power is applied via source power line 116 to the gas-supplying member 110 (the upper electrode). Furthermore, a bias power is applied via bias power line 118 to the susceptor 114b (the lower electrode). The magnitudes of the source power and the bias power applied to the gas-supplying member 110 and the susceptor 114b depend on the type of process, i.e., deposition process or etching process, which is being performed. Also, a first gas is introduced into the chamber 100. Thus, the gas is converted to the first plasma in the chamber 100 and is accelerated towards the substrate W. The composition of the first gas may also depend on the type of process which is being performed.

In any case, the semiconductor substrate W is processed using the first plasma in the chamber 100 under a pressure of about 0.001 to 10 torr (S31). For example, a pressure of about 0.001 to 0.1 torr is maintained in the chamber 100 when the semiconductor substrate W is processed using a high-density plasma such as an inductively coupled plasma (ICP) or an electron cyclotron resonance (ECR). Alternatively, a pressure of about 0.1 to 10 torr is maintained in the chamber 100 when the semiconductor substrate W is processed using a capacitively coupled plasma (CCP).

The generating of the first plasma is suspended (S33) after the semiconductor substrate W has been processed. In particular, the supplying of the first gas into the chamber 100 is terminated. Furthermore, the bias power and the first source power are cut off. At this time, the first source power may be cut off in a ramp down manner. That is, the first source power is decreased gradually in steps.

Subsequently, a purge gas is introduced into the chamber 100 to rid the chamber 100 of electric charges. Also, the supplying of direct current to the chuck 114a is cut off (S35) to eliminate the Coulomb force produced by the chuck 114a.

A second source power is then applied to the gas-supplying member 110 without the direct current power and the bias power being applied to the chuck 114a and the susceptor 114b, respectively. Also, a second gas is introduced into the chamber 100 when the second source power is applied to the gas-supplying member 110. Examples of the second gas include argon (Ar), helium (He), oxygen ($O_2$), hydrogen ($H_2$), xenon (Xe), and nitrogen ($N_2$). These can be used alone or in combination with each other. The magnitude of the second source power is preferably lower than that of the first source power. For example, the second source power is about 100 to about 5,000 Watts, preferably about 2,000 to 2,700 Watts, and more preferably about 2,500 Watts.

Accordingly, a second plasma is generated in the chamber 100 (S37). The second plasma has hardly any affect on the semiconductor substrate W because of the relatively low amount of energy used to create the second plasma. For example, the semiconductor substrate W is processed using the second plasma in the chamber under a pressure of about 0.001 to 10 torr. For example, a pressure of about 0.001 to 0.1 torr is maintained in the chamber when the semiconductor substrate W is processed using a high-density plasma such as an inductively coupled plasma (ICP) or an electron cyclotron resonance (ECR). Alternatively, a pressure of about 0.1 to 10 torr may be maintained in the chamber when the semiconductor substrate W is processed using a capacitively coupled plasma (CCP). However, the second plasma creates an attractive force, in a region spaced apart from the semiconductor substrate W, which is great enough to float contaminants off of the semiconductor substrate W and off of the region around the semiconductor substrate W (S39). That is, the contaminants are removed from the semiconductor substrate W by the attractive force.

Next, the applying of the second source power to the gas-supplying member via the source power supply line 116 is cut off. The semiconductor substrate W is lifted from the chuck 114a using a transfer member such as a blade (S41). The semiconductor substrate W is then unloaded from the chamber 100 (S43).

Measuring the Number of Particles in a Deposition Processes Using Plasma

Experiments were conducted to confirm the advantages of the present invention in reducing the contamination of a semiconductor substrate undergoing a deposition process using plasma. For these experiments, plasma deposition processes using a silane gas were performed on a semiconductor substrate on which a pattern was formed and on a bare semiconductor substrate, respectively. The plasma deposition processes were performed in three chambers.

Then the chambers were purged using oxygen. Next, oxygen, argon and helium were introduced into the chambers, respectively. A source power of 2,500 Watts was applied to the gases in each of the chambers to create a force for 10 seconds that attracted particles, generated as a result of the deposition process, away from the semiconductor substrates. The semiconductor substrates were then unloaded from the chambers.

The number of particles remaining in each of the chambers was measured after the deposition process was performed and after the semiconductor substrate was unloaded, respectively. In Table 1, the symbol (+) indicates an increase in the number of particles. The numbers under the heading S are for the semiconductor substrates on which a pattern was formed, and the numbers under the heading B are for the bare semiconductor substrates.

TABLE 1

| Chamber | The number of the particles | |
|---|---|---|
| No. | S | B |
| 1 | +7 | — |
| 1 | +36 | — |
| 1 | — | +14 |
| 1 | — | +16 |
| 2 | +8 | — |
| 2 | 23 | — |
| 2 | — | +15 |
| 2 | — | +33 |
| 3 | +21 | — |
| 3 | — | +7 |
| 3 | — | +23 |

As can be noted from the results shown in Table 1, an increase in the number of the particles is not overly dependent on the existence of a pattern on the semiconductor substrate. It shall also be noted that an increase in the number of the particles is not overly dependent on the kind of gas introduced into the chamber.

Next, experiments were carried out to measure the number of particles generated during conventional plasma deposition processes. The conventional plasma deposition processes all used silane gas as the source gas, and were performed on a bare semiconductor substrate. A source power was applied to the upper electrode under various process conditions: kind and flux of purge gas, vacuum in the chamber, and direct current power applied.

Table 2 illustrates the number of the particles in the chamber after the conventional deposition processes were performed and after the semiconductor substrates were unloaded, respectively. In Table 2, the symbol (+) indicates an increase in the number of particles.

TABLE 2

| Processing condition | The number of the particles |
|---|---|
| Oxygen gas, 200 sccm | +250 |
| Applying the direct current power and the source power | +30 |
| Providing vacuum | +114 |
| Helium gas, 100 sccm | +164 |
| Argon gas, 230 sccm | +250 |
| Argon gas, 250 sccm | +4,902 |
| Oxygen gas, 300 sccm | |
| Helium gas, 300 sccm | |

As can be noted from the results shown in Table 2, the number of the particles greatly increased except under the processing condition in which the direct current power and the source power were applied together. Nonetheless, in this case, the semiconductor substrate is repelled so as to pop up off of the chuck.

According to the present invention, as described above, a force that attracts particles is generated after the Coulomb force created using the chuck is eliminated. Thus, the particles are removed and the semiconductor substrate W will not pop up off the chuck 114a just before the substrate is transferred from the chamber 100. Furthermore, contaminants are removed from the semiconductor substrate without the need for components beyond those used in the processing of the substrate. Therefore, the present invention can enhance the reliability and efficiency of a process of manufacture, such as a process for manufacturing a semiconductor device.

Finally, although the present invention has been described above in connection with the preferred embodiments thereof, the invention is not so limited. Rather, those skilled in the art will readily appreciate that the disclosed embodiments may be modified without materially departing from the true spirit and scope of the invention. Accordingly, the scope of this invention is defined not by the detailed description of the preferred embodiments but by the appended claims.

What is claimed is:

1. A method of processing an object using a plasma, comprising:
placing the object in a chamber;
generating a Coulomb force that fixes the object in place in the chamber;
generating a plasma by providing a first source gas, and exciting the first source gas with a source power;
processing the object within the chamber using the plasma, wherein the processing creates contaminant particles;
extinguishing the plasma after the object has been processed;
eliminating the Coulomb force after the object has been processed; and
subsequently creating an electrical force, sufficient to attract the contaminant particles away from the object in the chamber, by providing a second source gas excited with a source power in a region of the chamber spaced from the substrate.

2. The method of claim 1, wherein the processing of the object comprises depositing material on the object or etching the object.

3. The method of claim 1, wherein the generating of the plasma in the chamber comprises supplying the first source gas into the chamber and exciting the first source gas in the chamber with the source power, and the extinguishing of the plasma comprises cutting off the supply of the first source gas into the chamber, and terminating the application of the source power to the first source gas in a ramp down manner in which the level of the source power is reduced in a series of increments over time.

4. The method of claim 1, wherein the second source gas comprises at least one gas selected from the group consisting of argon, helium, oxygen, hydrogen, xenon and nitrogen.

5. The method of claim 1, wherein the generating of the plasma comprises exciting the first source gas with a first level of source power, and the creating of the electrical force, sufficient to attract the contaminant particles away from the object in the chamber, comprises exciting the second source gas with a second level of source power that is lower than the first level of the source power applied to the first source gas to generate the plasma.

6. The method of claim 5, wherein the second level of the source power applied to the second source gas to create the electrical force is about 100 to about 5,000 Watts.

7. A method of controlling the processing of an object using a plasma, comprising:
supplying a first gas into a chamber in which the object is located;
firstly applying a source power to a first electrode in the chamber to convert the first gas into a first plasma;
applying a bias power to a second electrode in the chamber while the source power is being applied to the first electrode to accelerate ions of the first plasma towards the second electrode;
processing the object using the first plasma;
subsequently cutting off the supply of the first gas into the chamber, terminating the application of the source power to the first electrode, and terminating the application of the bias power to the second electrode to extinguish the first plasma, thereby finishing the processing of the object;
subsequently supplying a second gas into the chamber; and
secondly applying a source power to the first electrode without applying power to the second electrode to convert the second gas to a second plasma in a region of the chamber spaced from the object, wherein the second plasma creates an electrical force sufficient to attract contaminant particles, thereby causing the contaminant particles to float away from the object in the chamber.

8. The method of claim 7, further comprising generating a Coulomb force, that fixes the object in place in the chamber, while the object is being processed.

9. The method of claim 8, wherein the Coulomb force is generated by disposing the object on an electrostatic chuck in the chamber, and supplying direct current to the electrostatic chuck.

10. The method of claim 9, wherein the supplying of direct current to the electrostatic chuck is cut off while the source power is being applied to the first electrode to convert the second gas to the second plasma.

11. The method of claim 7, wherein the processing of the object comprises depositing material on the object or etching the object.

12. The method of claim 7, wherein terminating the application of the source power to the first electrode is performed in a ramp down manner in which the level of the source power is reduced in increments over time.

13. The method of claim 7, wherein the second gas comprises at least one gas selected from the group consisting of argon, helium, oxygen, hydrogen, xenon and nitrogen.

14. The method of claim 7, wherein a first level of source power is applied to the first electrode in the chamber to convert the first gas into the first plasma, a second level of source power is applied to the first electrode in the chamber to convert the second gas into the second plasma, and the second level of the source power applied to the first electrode to convert the second gas to the second plasma is lower than the first level of the source applied to the first electrode to convert the first gas to the first plasma.

15. The method of claim 14, wherein the level of the source power applied to the first electrode to convert the second gas to the second plasma is about 100 to about 5,000 Watts.

16. The method claim 7, wherein the supplying of the first gas into the chamber comprises supplying the first gas through a gas-supplying member into the chamber, the applying of the source power to the first electrode in the chamber to convert the first gas into the first plasma comprises applying the source power to the gas-supplying member whereby the gas-supplying member serves as the first electrode, and the applying of the bias power to a second electrode comprises applying the bias power to a susceptor of a substrate support on which the substrate rests.

17. The method of claim 9, wherein the supplying of direct current to the electrostatic chuck is cut off before the source power is ever applied to the first electrode to convert the second gas to the second plasma.

* * * * *